United States Patent
Kaneda et al.

(10) Patent No.: US 10,321,075 B2
(45) Date of Patent: Jun. 11, 2019

(54) IMAGING APPARATUS AND IMAGING SYSTEM

(71) Applicant: CANON KABUSHIKI KAISHA, Tokyo (JP)

(72) Inventors: Tasuku Kaneda, Kawasaki (JP); Kei Ochiai, Inagi (JP); Akira Ohtani, Ebina (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/799,251

(22) Filed: Oct. 31, 2017

(65) Prior Publication Data
US 2018/0139400 A1 May 17, 2018

(30) Foreign Application Priority Data
Nov. 16, 2016 (JP) ................................. 2016-222937

(51) Int. Cl.
*H04N 5/378* (2011.01)
*H01L 27/146* (2006.01)
*H04N 5/359* (2011.01)

(52) U.S. Cl.
CPC ....... *H04N 5/3597* (2013.01); *H01L 27/1463* (2013.01); *H01L 27/14605* (2013.01); *H01L 27/14623* (2013.01); *H04N 5/378* (2013.01)

(58) Field of Classification Search
CPC .................. H04N 5/3597; H04N 5/378; H01L 27/14605; H01L 27/14623; H01L 27/1463
See application file for complete search history.

(56) References Cited

U.S. PATENT DOCUMENTS

| | | | |
|---|---|---|---|
| 7,393,715 B2 | 7/2008 | Tazoe et al. | |
| 8,988,569 B2 | 3/2015 | Minami et al. | |
| 9,554,069 B2 | 1/2017 | Shimizu et al. | |
| 9,704,909 B2 | 7/2017 | Kaneda | |
| 2010/0309357 A1 | 12/2010 | Oike | |
| 2011/0019038 A1 | 1/2011 | Okuno | |

(Continued)

FOREIGN PATENT DOCUMENTS

| | | |
|---|---|---|
| JP | 2006-203308 A | 8/2006 |
| JP | 2007-150720 A | 6/2007 |

(Continued)

OTHER PUBLICATIONS

U.S. Appl. No. 15/711,105, filed Sep. 21, 2017, by Kei Ochiai, et al.

*Primary Examiner* — Hung H Lam
(74) *Attorney, Agent, or Firm* — Venable LLP

(57) ABSTRACT

Provided is an imaging apparatus including a pixel array in which a plurality of pixels are arranged in a matrix, each of the pixels comprising a photoelectric conversion portion. The pixel array includes a first pixel configured to output an imaging signal in accordance with an incident light and a second pixel configured to output a correction signal used for correcting the imaging signal. The second pixel outputs the correction signal after performing a first reset performed in a state where a first bias voltage is applied to the photoelectric conversion portion of the second pixel and a second reset performed in a state where a second bias voltage that is different from the first bias voltage is applied to the photoelectric conversion portion.

18 Claims, 9 Drawing Sheets

(56) References Cited

U.S. PATENT DOCUMENTS

| | | | |
|---|---|---|---|
| 2011/0228144 A1* | 9/2011 | Tian | H04N 5/3575 |
| | | | 348/243 |
| 2013/0075591 A1 | 3/2013 | Otake et al. | |
| 2013/0082166 A1 | 4/2013 | Sugawara et al. | |
| 2013/0100302 A1 | 4/2013 | Senda et al. | |
| 2014/0084410 A1 | 3/2014 | Okigawa | |
| 2014/0146211 A1 | 5/2014 | Mori et al. | |
| 2014/0253774 A1 | 9/2014 | Ogura et al. | |
| 2014/0367552 A1* | 12/2014 | Hynecek | H01L 27/14614 |
| | | | 250/208.1 |
| 2016/0225803 A1* | 8/2016 | Korobov | H01L 27/1464 |
| 2017/0155862 A1 | 6/2017 | Kobayashi et al. | |
| 2017/0328776 A1* | 11/2017 | Shimasaki | G01J 1/0407 |
| 2018/0146154 A1* | 5/2018 | Sato | H01L 27/146 |
| 2018/0227526 A1* | 8/2018 | Tokuhara | H01L 27/146 |

FOREIGN PATENT DOCUMENTS

| | | |
|---|---|---|
| JP | 2013-98825 A | 5/2013 |
| JP | 2015-8343 A | 1/2015 |
| JP | 2015-95846 A | 5/2015 |
| JP | 2016-29756 A | 3/2016 |
| JP | 2016-100819 A | 5/2016 |
| WO | 2011/148574 | 12/2011 |
| WO | 2012/165255 | 12/2012 |
| WO | 2013/021577 | 2/2013 |
| WO | 2013/046385 | 4/2013 |

\* cited by examiner

IMAGING APPARATUS AND IMAGING SYSTEM

BACKGROUND OF THE INVENTION

Field of the Invention

The present invention relates to an imaging apparatus and an imaging system.

Description of the Related Art

In some of imaging systems in recent years such as a digital camera, various functions such as a motion image capturing function, a live view display function, or the like are implemented in addition to a static image capturing function. Japanese Patent Application Laid-Open No. 2016-29756 discusses a problem of a residual image occurring when a digital camera is switched from a state of live view display (alternatively motion image capturing) to a state of static image capturing. This residual image is caused because signal charges trapped in a defect level at live view display are emitted with time elapsing during readout drive of a static image. In order to reduce such a residual image, an imaging apparatus of Japanese Patent Application Laid-Open No. 2016-29756 has residual image correction means for acquiring the amount of the residual image based on a signal read out from a light-shielding pixel or the like.

Further, Japanese Patent Application Laid-Open No. 2013-98825 discusses a problem that a part of signal charges of a frame remains in a pixel and thereby a residual image due to the remaining signal charges occurs at pickup of an image during the next frame period resulting in image quality degradation. As a solution for reducing such a residual image, it is proposed that different voltages are applied to a photoelectric conversion element at a preliminary reset before pickup of an image and at a primary reset, respectively. Further, it is disclosed that occurrence of a residual image can be reduced by performing the same subtraction process on respective pixels for subtraction of residual charges caused by a preliminary reset.

In the schemes disclosed by Japanese Patent Application Laid-Open No. 2016-29756 and Japanese Patent Application Laid-Open No. 2013-98825, however, an accuracy of correction may be insufficient, and thus there is a demand for a scheme that can acquire a correction signal at a high accuracy.

SUMMARY OF THE INVENTION

An imaging apparatus according to one embodiment of the present invention includes a pixel array in which a plurality of pixels are arranged in a matrix, each of which comprises a photoelectric conversion portion, the pixel array includes a first pixel configured to output an imaging signal in accordance with an incident light and a second pixel configured to output a correction signal used for correcting the imaging signal, and the second pixel outputs the correction signal after performing a first reset performed in a state where a first bias voltage is applied to the photoelectric conversion portion of the second pixel and a second reset performed in a state where a second bias voltage that is different from the first bias voltage is applied to the photoelectric conversion portion.

An imaging system according to one embodiment of the present invention includes an imaging apparatus including a pixel array in which a plurality of pixels are arranged in a matrix, each of which comprises a photoelectric conversion portion, the pixel array includes a first pixel configured to output an imaging signal in accordance with an incident light and a second pixel configured to output a correction signal used for correcting the imaging signal, and the second pixel outputs the correction signal after performing a first reset performed in a state where a first bias voltage is applied to the photoelectric conversion portion of the second pixel and a second reset performed in a state where a second bias voltage that is different from the first bias voltage is applied to the photoelectric conversion portion.

Further features of the present invention will become apparent from the following description of exemplary embodiments with reference to the attached drawings.

DESCRIPTION OF THE EMBODIMENTS

Figure 1:
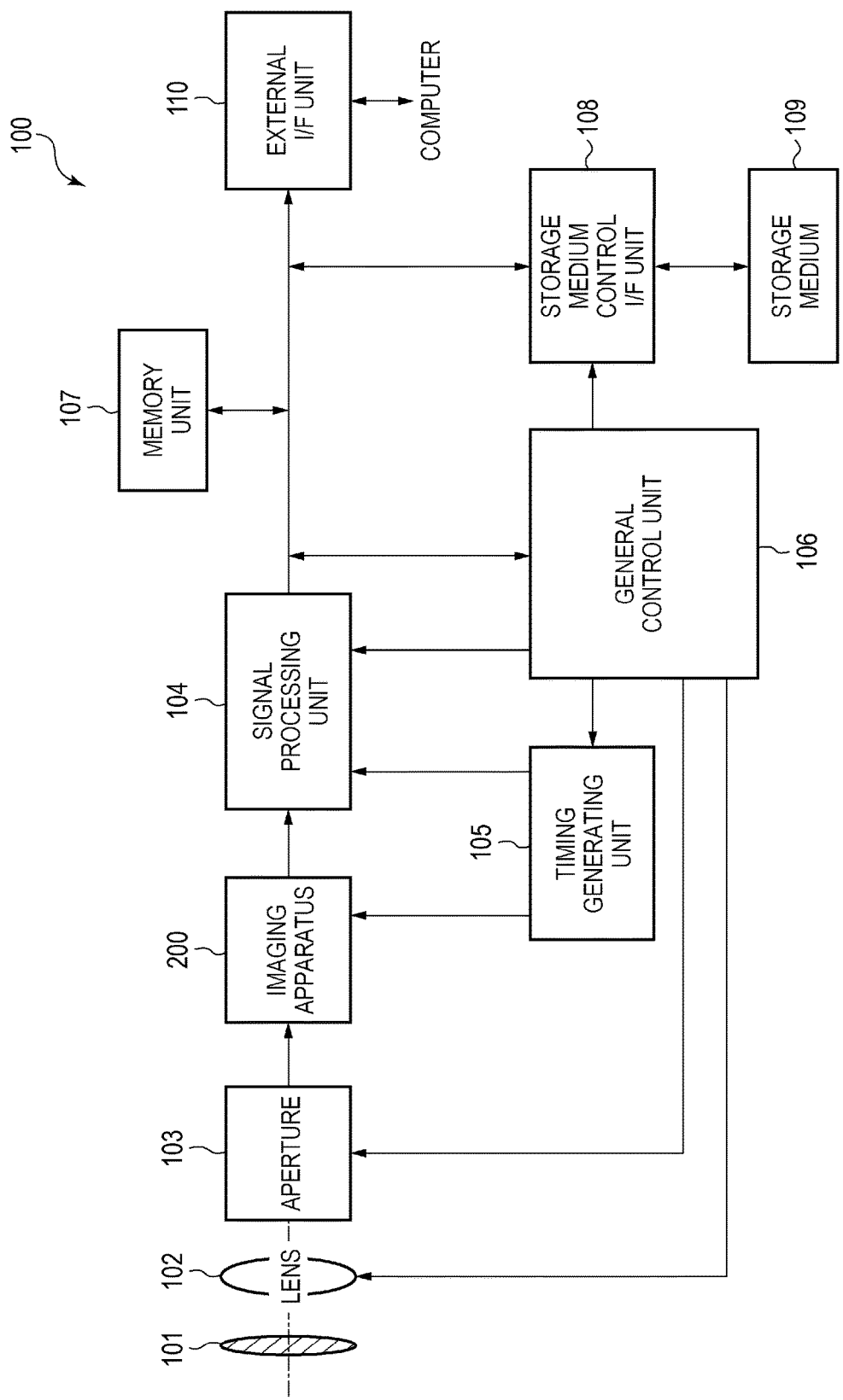
FIG. 1 is a block diagram of an imaging system according to a first embodiment of the present invention.

Preferred embodiments of the present invention will now be described in detail in accordance with the accompanying drawings. Elements having the same function throughout a plurality of drawings are labeled with the same reference numeral, and the description thereof may be simplified or omitted.

First Embodiment

FIG. 1 is a block diagram illustrating the configuration of an imaging system according to a first embodiment of the present invention. While not limited in particular, an imaging system 100 according to the present embodiment is applicable to a digital still camera, a digital video camera, a copier machine, a mobile phone, an on-vehicle camera, an observation satellite, an infrared ray camera, or the like, for example.

The imaging system 100 has an imaging apparatus 200, a mechanical shutter 101, a lens 102, an aperture 103, and a signal processing unit 104. Furthermore, the imaging system 100 has a timing generating unit 105, a general control unit 106, a memory unit 107, a storage medium control I/F unit 108, a storage medium 109, and an external I/F unit 110.

The mechanical shutter 101 is a component arranged on the light incidence side (on the subject side) of the imaging apparatus 200 so as to control an incident light to a light-receiving pixel. The lens 102 is a component for causing an optical image of a subject to be captured on a light-receiving unit (a pixel array) of the imaging apparatus 200. The aperture 103 is a component for changing a light amount passing through the lens 102. The imaging apparatus 200 is an image sensor formed on a semiconductor substrate and is a device that converts an optical image captured on the pixel array by the lens 102 into image data. While the mechanical shutter 101 is arranged on the subject side of the lens 102 in this example, the mechanical shutter 101 may be arranged on the imaging apparatus 200 side of the lens 102 or the aperture 103. The imaging system 100 may have a barrier for protecting the mechanical shutter 101, the lens 102, the aperture 103, or the imaging apparatus 200.

The signal processing unit 104 is a section that performs various processes such as correction, data compression or the like on image data output from the imaging apparatus 200. The timing generating unit 105 is a section that outputs various timing signals to the imaging apparatus 200 and the signal processing unit 104. The signal processing unit 104 and the timing generating unit 105 may be mounted on the same substrate as the imaging apparatus 200, or may be mounted on separate substrates. As an example, the imaging system 100 may be configured to have at least one of the mechanical shutter 101 and the signal processing unit 104 that processes image data output from the imaging apparatus 200. The general control unit 106 is a section that controls the entire imaging system 100. Note that a control signal such as a timing signal may be input from the outside of the imaging system 100, and the imaging system 100 may have at least the imaging apparatus 200 and the signal processing unit 104 that processes image data output from the imaging apparatus 200. The image data output from the imaging apparatus 200 may be analog data or may be digital data.

The memory unit 107 is a frame memory for temporarily storing image data. The storage medium control I/F unit 108 is an interface for performing storage to the storage medium 109 or readout from the storage medium 109. The storage medium 109 is a removable storage medium such as a semiconductor memory for performing storage or readout of image data or storage medium embedded in the imaging system 100. The external I/F unit 110 is an interface for communication with an external computer or the like.

With the configuration as described above, the imaging system 100 having the imaging apparatus 200 implements image capturing of an image and processing of image data. In the following, the configuration of the imaging apparatus 200 that may be applied to the imaging system 100 will be described in detail.

Figure 2:
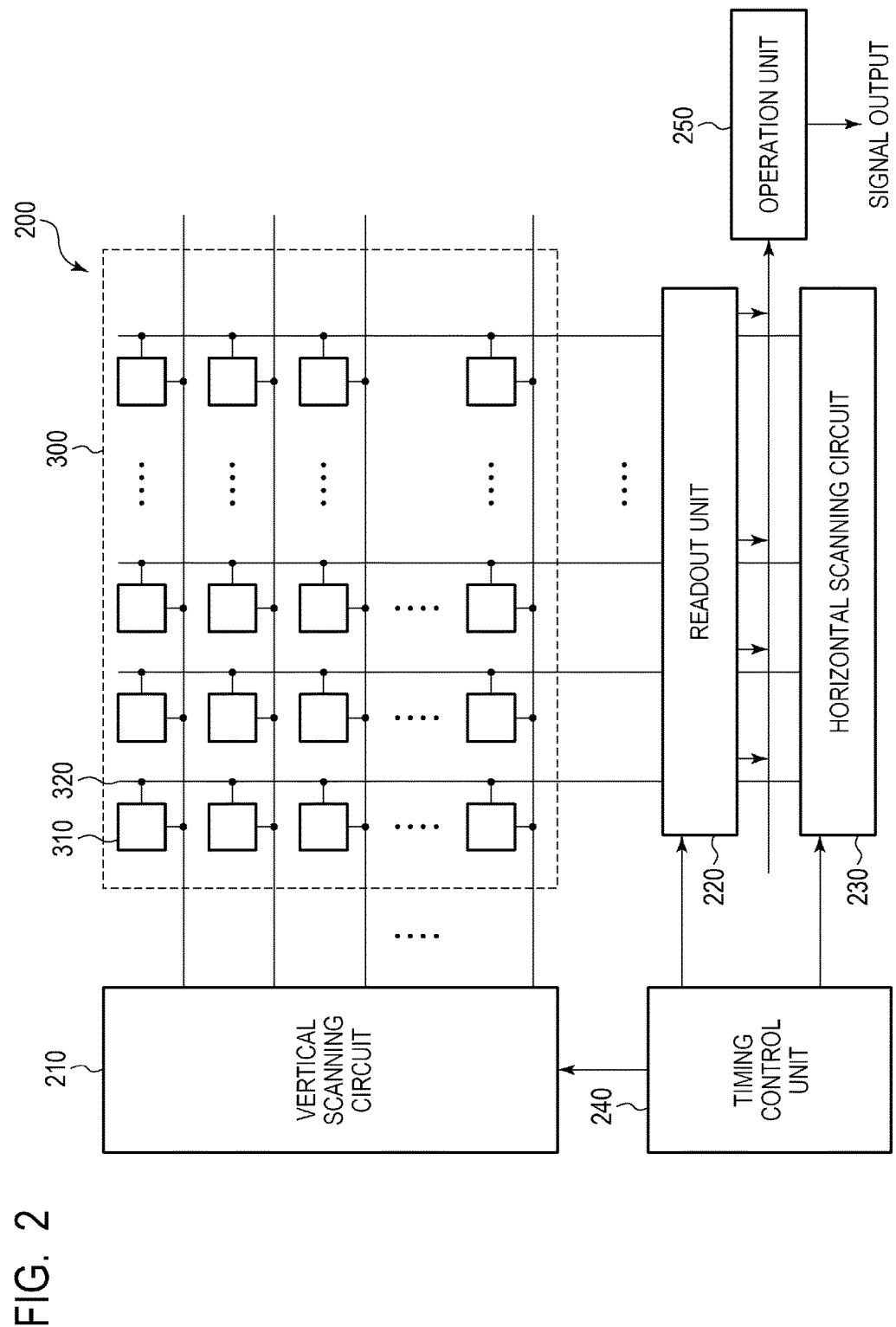
FIG. 2 is a block diagram of an imaging apparatus according to the first embodiment of the present invention.

FIG. 2 is a block diagram illustrating the configuration of the imaging apparatus 200 according to the first embodiment of the present invention. As illustrated in FIG. 2, the imaging apparatus 200 has a pixel array 300, a vertical scanning circuit 210, a readout unit 220, a horizontal scanning circuit 230, a timing control unit 240, and an operation unit 250. The pixel array 300 has a plurality of pixels 310 arranged in a matrix. Each of vertical signal lines 320 provided on a column basis is connected to each of the pixels 310 as a wiring for outputting a signal.

The vertical scanning circuit 210 sequentially selects rows of the pixels 310 of the pixel array 300 in the vertical direction in accordance with a control signal from the timing control unit 240 to output signals from respective pixels 310 to the readout unit 220 via the vertical signal lines 320. The readout unit 220 is configured including gain amplifiers, analog-to-digital (AD) converters, or the like associated with respective columns of the pixels 310 and samples, on a column basis, signals output from the pixels 310 on the row selected by the vertical scanning circuit 210. The horizontal scanning circuit 230 sequentially selects, in the horizontal direction, signals from respective pixels 310 sampled to the readout unit 220 to output signals to the operation unit 250. The operation unit 250 performs a predetermined operation process on signals output from the pixels 310. The details of this operation process will be described later.

Figure 3:
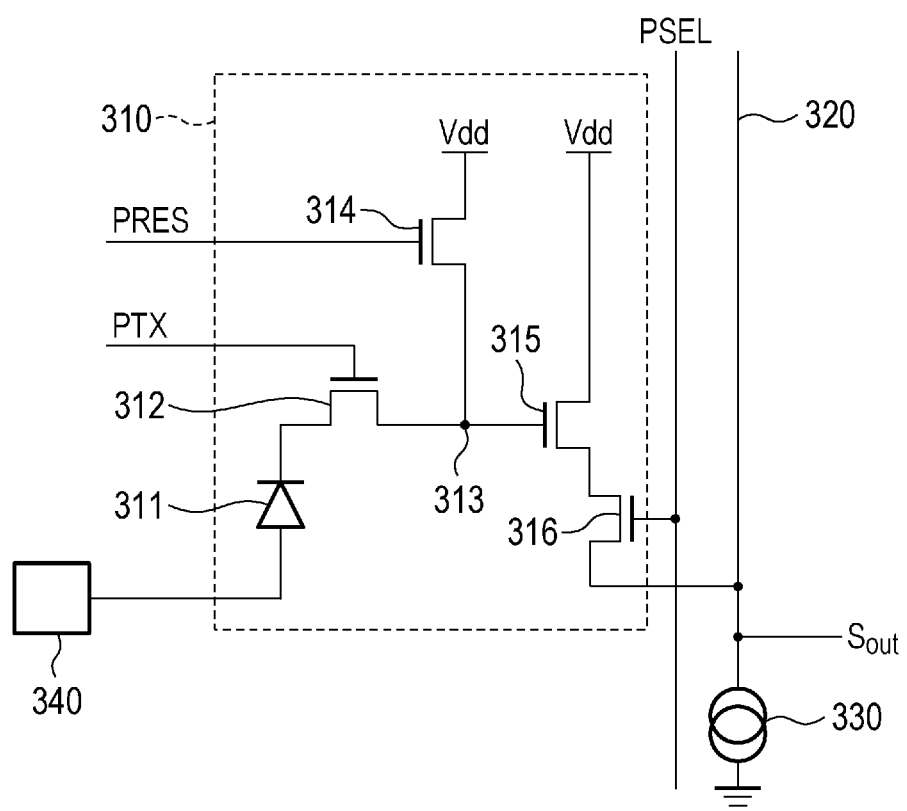
FIG. 3 is circuit diagram of a pixel according to the first embodiment of the present invention.

FIG. 3 is a circuit diagram of the pixel 310 according to the first embodiment of the present invention. For simplified illustration, FIG. 3 depicts only the equivalent circuit of one of the pixels 310 and the output path of a signal output from the pixel 310. The pixel 310 has a photodiode (hereafter, referred to as PD) 311, a transfer transistor 312, a floating diffusion (hereafter, referred to as FD) 313, a reset transistor 314, an amplification transistor 315, and a selection transistor 316. The PD 311 forms a photoelectric conversion portion that generates and accumulates charges in accordance with an incident light. The transfer transistor 312 is driven by a control signal PTX from the vertical scanning circuit 210 and transfers charges accumulated on the cathode side of the PD 311 to the FD 313. The FD 313 functions as a charge-potential conversion portion (a charge-voltage conversion portion) that converts charges into a potential (a voltage) by obtaining a potential in accordance with the held charges and the capacity of the FD 313.

The anode of the PD 311 is connected with a well potential supply unit 340. The well potential supply unit 340 is driven by a control signal from the timing control unit 240 and supplies various potentials to the well in which the pixel 310 is formed in accordance with an operation mode. The well potential supply unit 340 is able to supply different potentials at the same time for the plurality of pixels 310 within the pixel array 300.

The reset transistor 314 is driven by a control signal PRES and configured to be able to drain charges held in the FD 313 to a power source line having a potential Vdd. The gate terminal, which is an input of the amplification transistor 315, is connected with the FD 313. The drain of the amplification transistor 315 is connected to the power source line, and the source thereof is connected to the drain of the selection transistor 316. The source of the selection transistor 316 is connected to the vertical signal line 320. The selection transistor 316 is driven by a control signal PSEL and connects the source of the amplification transistor 315 to a constant current source 330 provided on the vertical signal line 320. Thereby, the amplification transistor 315 and the constant current source 330 form a source follower circuit that outputs a signal based on the potential of the FD 313 as an output potential $S_{out}$. Signals output to the vertical signal lines 320 are sampled for each vertical signal line 320 by the readout unit 220 and then output to the post-stage operation unit 250.

Figure 4A:
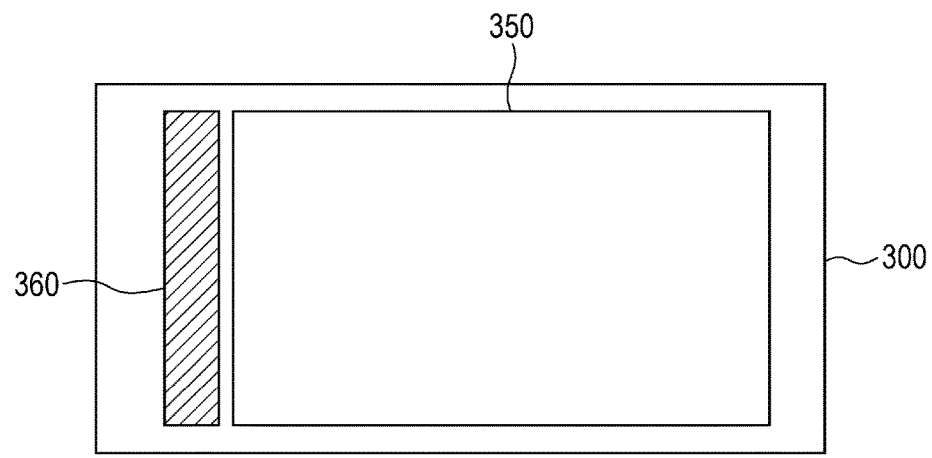
FIG. 4A and FIG. 4B are diagrams illustrating a pixel array configuration according to the first embodiment of the present invention.

FIG. 4A is a schematic top view illustrating the structure of the pixel array 300 according to the first embodiment of the present invention. The pixel array 300 has an imaging pixel portion 350 in which imaging pixels that output imaging signals in accordance with an incident light are arranged and a correction pixel portion 360 in which correction pixels that output correction signals for correcting the image signals are arranged. Each of the imaging pixels and the correction pixels is the pixel 310 having the circuit configuration represented by the equivalent circuit illustrated in FIG. 3. In the present embodiment, however, a light-shielding pixel forming the correction pixel has a different sectional structure from the imaging pixel. The imaging pixel has an opening that passes an incident light onto the PD 311 and is a light-receiving pixel having the structure by which the incident light enters the PD 311 and the PD 311 receives the light, and therefore may also be referred to as an effective pixel. In contrast, the light-shielding pixel has a light-shielding portion that shields the PD 311 from an incident light. The light-shielding portion is a wiring or the like whose primary material is aluminum or the like and covers the upper part of the PD 311. This structure enables the light-shielding pixel to output a correction signal for correcting an imaging signal. Note that, while the correction pixel portion 360 is arranged in the left edge of the pixel array 300 in FIG. 4A, without being limited thereto, the imaging pixel portion 350 and the correction pixel portion 360 may be provided to any portion within the pixel array 300.

Figure 4B:
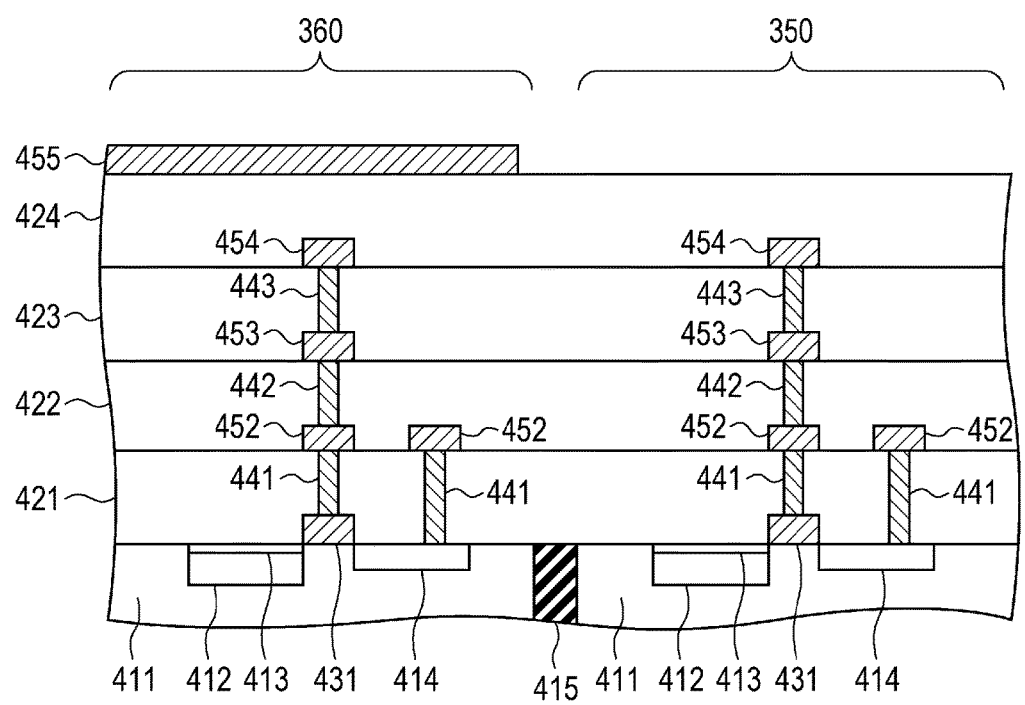

FIG. 4B is a schematic sectional view around the boundary between the imaging pixel portion 350 and the correction pixel portion 360 of FIG. 4A. FIG. 4B depicts semiconductor regions 411, 412, 413, and 414 and an isolation region 415 that are formed inside a semiconductor substrate. Furthermore, FIG. 4B depicts a gate electrode 431, interlayer connection wirings 441, 442, and 443, wirings 452, 453, and 454, interlayer insulating layers 421, 422, 423, and 424, and a light-shielding portion 455 that are formed on the semiconductor substrate. The semiconductor regions 411 and 413 each are a P-type semiconductor region, and the semiconductor regions 412 and 414 each are an N-type semiconductor region.

The semiconductor regions 411, 412, and 413 have the embedded photodiode structure and correspond to the PD 311 of FIG. 3. The P-type semiconductor region 413 is arranged between the N-type semiconductor region 411 and the surface of the semiconductor substrate that is a light-receiving surface. The semiconductor region 411 and the semiconductor region 413 may be an electrically continuous P-type semiconductor region. The well potential supply unit 340 in FIG. 3 supplies a potential to the P-type well semiconductor region 411 and the P-type semiconductor region 413 formed in the semiconductor substrate. The gate electrode 431 and the semiconductor regions 411, 412, and 414 form a MOS transistor and correspond to the transfer transistor 312 of FIG. 3. The semiconductor region 414 corresponds to the FD 313 of FIG. 3. The interlayer connection wirings 441, 442, and 443 and the wirings 452, 453, and 454 are wirings that transfer signals between the gate electrode 431, the FD 313, and the like and the outside.

The isolation region 415 is formed at the boundary between the imaging pixel portion 350 and the correction pixel portion 360. The isolation region 415 electrically isolates the semiconductor region 411 of the imaging pixel portion 350 from the semiconductor region 411 of the correction pixel portion 360 and thereby allows different potentials to be provided thereto. In the correction pixel portion 360, the light-shielding portion 455 that shields the PD 311 from the incident light is formed above the PD 311. In contrast, the imaging pixel portion 350 is provided with no light-shielding portion 455 and structured such that an incident light enters the PD 311.

Figure 5A:
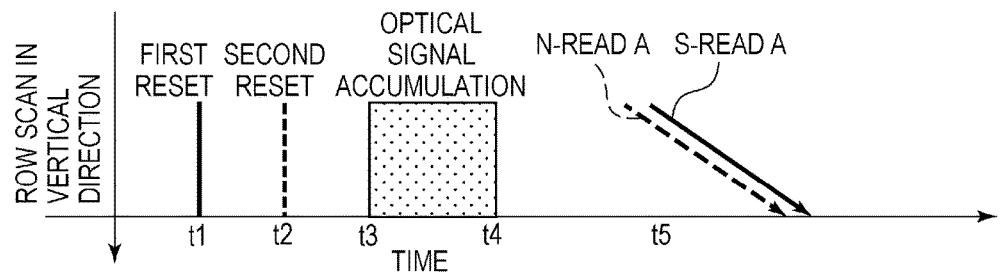
FIG. 5A, FIG. 5B, FIG. 5C, and FIG. 5D are diagrams illustrating a drive method of the imaging apparatus according to the first embodiment of the present invention.

FIG. 5A is a timing chart illustrating a drive method at static image capturing of the imaging pixel portion 350 according to the first embodiment of the present invention. Note that, while the imaging system 100 and the imaging apparatus 200 are described assuming that the accumulation time (the exposure time) is set by an electronic front curtain shutter and the mechanical shutter 101 in this timing chart, the imaging system 100 and the imaging apparatus 200 are not limited thereto. Since a general scheme may be used for the specific operation for the setting of the accumulation time, detailed description thereof will be omitted.

At the time t1, first reset is performed in each pixel 310 within the imaging pixel portion 350. The first reset is an operation that turns on the transfer transistor 312 and the reset transistor 314 while maintaining the potential supplied from the well potential supply unit 340 to the semiconductor regions 411 and 413 at a low potential such as 0 V, for example. This causes charges accumulated in the PD 311 to be reset with a reverse bias voltage (a first bias voltage) being applied to the PD 311.

At the time t2, second reset is performed in each pixel 310 within the imaging pixel portion 350. In the second reset, reset is performed in a state where the potential supplied from the well potential supply unit 340 to the semiconductor regions 411 and 413 is switched to a potential which is different from the potential in the first reset. Specifically, in the second reset, the transfer transistor 312 and the reset transistor 314 are turned on while the supplied potential is maintained to a high potential such as 5 V, for example. This allows for performing reset that causes the defect level Et in the semiconductor region of the PD 311 to capture electrons with a forward bias voltage (a second bias voltage) being applied to the PD 311. Charges captured in the defect level Et are emitted with time elapsing, which may cause a residual image. By causing electrons to be captured in the defect level Et in advance in the second reset, the intensity of subsequently generated residual images can be even.

In a period from the time t3 to the time t4, accumulation of charges occurring in response to an incident light (optical signal accumulation) is performed in the PD 311. The start of accumulation (time t3) is controlled by the electronic front curtain shutter, and the end of accumulation (time 4) is controlled by the mechanical shutter 101 provided to the imaging system 100.

Then, around the time t5, readout of a signal corresponding to a reset state of the FD 313 before transfer of accumulated charges (hereafter, referred to as "N-read A") and readout of a signal after the charge transfer (hereafter, referred to as "S-read A") are performed. The N-read A and the S-read A are performed by turning on the selection transistors 316 sequentially on a row basis of the pixel array 300. On each row, the N-read A is performed in a state after the FD 313 is reset and before the transfer transistor 312 is turned on. The transfer transistor 312 is then turned on, charges accumulated in the PD 311 are transferred to the FD 313, and the S-read A is performed. The signal obtained in this S-read A is a signal corresponding to charges in accordance with an incident light and charges emitted from the defect level Et and is an imaging signal containing a component of a residual image.

Figure 5B:
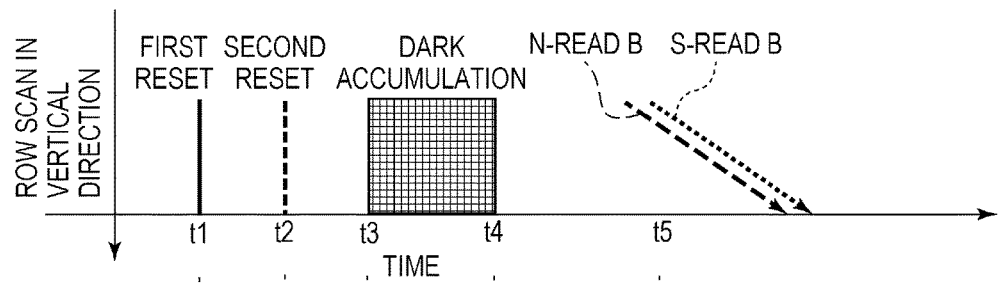

FIG. 5B is a timing chart illustrating a drive method at static image capturing of the correction pixel portion 360 according to the first embodiment of the present invention. The drive operation illustrated in FIG. 5B is performed within the same frame period as the drive operation illustrated in FIG. 5A, and the time denoted with the same reference symbol is the same time. Since the operation performed at each time is the same as that in the operation of the imaging pixel portion 350 described with reference to FIG. 5A, the description thereof will be omitted. In each correction pixel of the correction pixel portion 360, the PD 311 is shielded from a light. Thus, in the correction pixel, a signal corresponding to a state where no incident light enters the PD 311 is obtained. This signal is used as the correction signal for correcting the imaging signal. In the correction pixel portion 360, the charge accumulation performed in the period from the time t3 to the time t4 is called dark accumulation. Further, two times of readout performed around the time t5 are called N-read B and S-read B, respectively. A signal obtained in the N-read B is the same as that in the N-read A in the imaging pixel portion 350. A signal obtained in the S-read B contains no component corresponding to charges in accordance with an incident light. Therefore, the signal obtained in the S-read B is a signal corresponding to charges emitted from the defect level Et and corresponds to the component of a residual image, and thus is used as the correction signal.

Figure 5C:
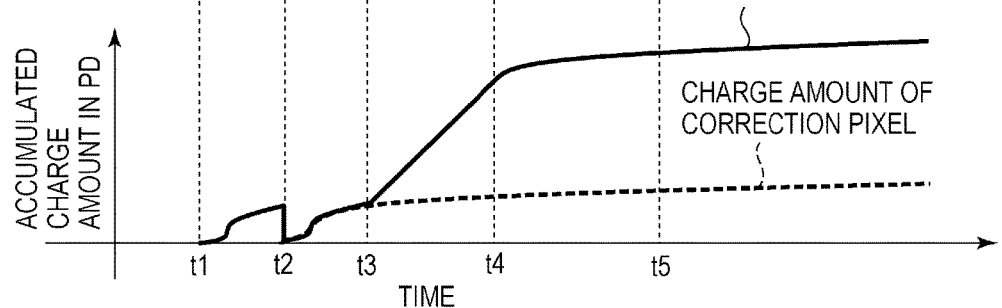

FIG. 5C is a graph illustrating a charge amount accumulated in the PD 311 at each time (PD accumulation charge amount) in the imaging pixel portion 350 and the correction pixel portion 360 of the first embodiment of the present invention. In FIG. 5C, the charge amount accumulated in the PD 311 of the imaging pixel of the imaging pixel portion 350 (charge amount of the imaging pixel) is depicted in a solid line, and the charge amount accumulated in the PD 311 of the correction pixel of the correction pixel portion 360 (charge amount of the correction pixel) is depicted in a dashed line. As described above, the charge amount of the imaging pixel is a sum of charges in accordance with an incident light and charges emitted from the defect level Et, and the charge amount of the correction pixel contains only the charges emitted from the defect level Et.

With reference to FIG. 5C, change in the charge amount in the PD 311 at each time will be described. First, at the time t1, both the charge amount of the imaging pixel and the charge amount of the correction pixel are zero as a result of the first reset. The charge amount of the imaging pixel and the charge amount of the correction pixel then increase with time elapsing from the time t1 to the time t2. This is because charges that have been captured in the defect level Et before the time t1 are emitted. This capturing of charges is due to an incident of a light to the PD 311 caused by live view, static image capturing, or the like performed before the time t1.

At the time t2, the charge amount of the imaging pixel and the charge amount of the correction pixel again become zero as a result of the second reset. In addition, in the second reset, a forward bias voltage is applied to each PD 311 of the imaging pixel portion 350 and the correction pixel portion 360, and the Fermi level of electrons increases. This results in a state where electrons are fully captured in the defect level Et present in the semiconductor region of the PD 311. That is, on and after the time t2, the charge amount of the imaging pixel and the charge amount of the correction pixel increase with time elapsing due to emission of charges from the defect level Et.

In the period from the time t3 to the time t4, the charge amount of the imaging pixel sharply increases in proportional to time by optical signal accumulation. In contrast, since the correction pixel is shielded from a light, the charge amount of the correction pixel increases due to only electron emission from the defect level Et. In the period from the time t4 to the time t5, the charge amount of the imaging pixel and the charge amount of the correction pixel gradually increase with time elapsing due to emission of charges from the defect level Et.

As discussed above, the charge amount of the imaging pixel includes charges emitted from the defect level Et, which may cause a residual image. Since a time constant of capturing and emission of charges at the defect level Et varies with parameters such as a temperature at image capturing or the like, the correction of such a residual image will be more accurate when performed by using the correction signal acquired from the correction pixel on a row basis at image capturing than when performed by using a preset correction value. In the present embodiment, a signal corresponding to charges emitted from the defect level Et can be acquired as the correction signal from the correction pixel on each row within the same frame period as image capturing. Therefore, according to the configuration of the present embodiment, a correction signal can be acquired at a high accuracy. The use of such a correction signal allows accurate correction of an imaging signal to be performed. Further, in the present embodiment, the charge amount of the imaging pixel and the charge amount of the correction pixel can be acquired within the same imaging apparatus 200 and at the same time. Thus, even when charges emitted from the defect level Et varies depending on the temperature at image capturing and the timing of readout, a correction signal can be acquired at a high accuracy in an appropriate manner.

Figure 5D:
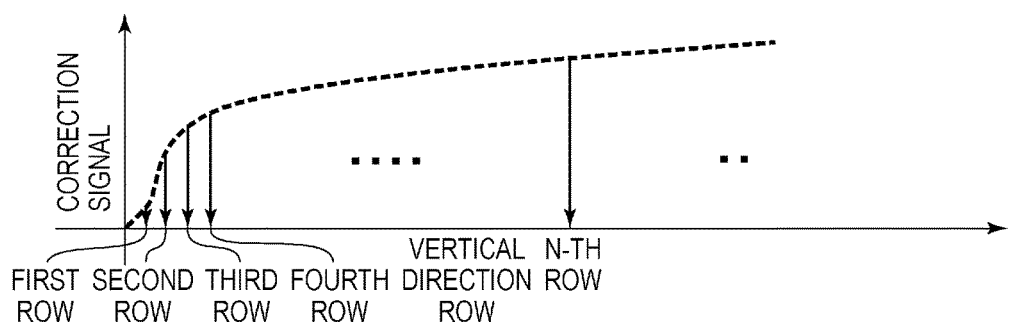

FIG. 5D is a graph illustrating the intensity of correction signals on respective rows. With reference to FIG. 5D, a method of calculating a correction value by using a correction signal output from the correction pixel portion 360 will be described. In the S-read B, since readout is performed sequentially from the first row, the accumulation time period of charges emitted from the defect level Et is longer for a row with a larger number. Thus, since the intensity of the correction signal is larger for a row with a larger number, it is preferable to use different correction values for respective rows. In the present embodiment, a correction value applied to an imaging signal on each row can be calculated for every row by using a correction signal obtained from a correction pixel on each row. As an example, correction on the n-th row will be described. By using correction signals $N_{n,\,1}$, $N_{n,\,2}, \ldots, N_{n,\,m}$ obtained from a plurality of correction pixels on the n-th row, a correction value $C_n$ for the n-th row can be calculated by the following Equation 1.

$$C_n = \mathrm{Median}(N_{n,\,1}, N_{n,\,2}, \ldots, N_{n,\,m}) \times k \qquad \text{(Equation 1)}$$

Note that Median $(N_{n,\,1}, N_{n,\,2}, \ldots, N_{n,\,m})$ means the median of $N_{n,\,1}, N_{n,\,2}, \ldots, N_{n,\,m}$. Further, k is a predetermined coefficient.

For an imaging signal $S_{n,\,p}$ obtained from the imaging pixel at the n-th row and the p-th column, an image signal $P_{n,\,p}$ in which a residual image due to charges emitted from the defect level Et has been corrected can be obtained by subtraction of the correction value $C_n$ for the n-th row as indicated in the following Equation 2.

$$P_{n,\,p} = S_{n,\,p} - C_n \qquad \text{(Equation 2)}$$

The above-described operation of calculation and correction of the correction value may be performed in the operation unit 250 illustrated in FIG. 2. However, this operation is not required to be performed at the imaging apparatus 200, and may be performed at the signal processing unit 104 in the imaging system 100, for example. In this case, the operation unit 250 may be omitted. Although the above-described operation of calculation and correction of the correction value can be performed based on an analog signal based on the imaging signal or the correction signal, an operation performed based on a digital signal based on the imaging signal or the correction signal is preferable in terms of an easier operation of calculation and correction of the correction value. Thus, the imaging apparatus 200 may have an AD converter in the readout unit 220 that converts an analog signal based on the imaging signal or the correction signal into a digital signal.

As discussed above, the configuration of acquiring a correction signal from a correction pixel in addition to acquiring an imaging signal from an imaging pixel allows for acquiring an accurate correction signal. Further, by calculating a correction value by using such a correction signal to perform correction based thereon, a residual image can be corrected at a high accuracy, and a high quality image signal can be output.

Second Embodiment

Figure 6A:
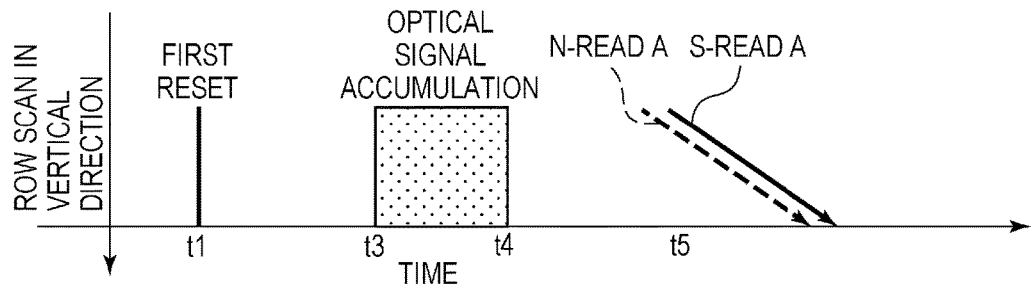
FIG. 6A, FIG. 6B, and FIG. 6C are diagrams illustrating a drive method of an imaging apparatus according to a second embodiment of the present invention.
Figure 6B:
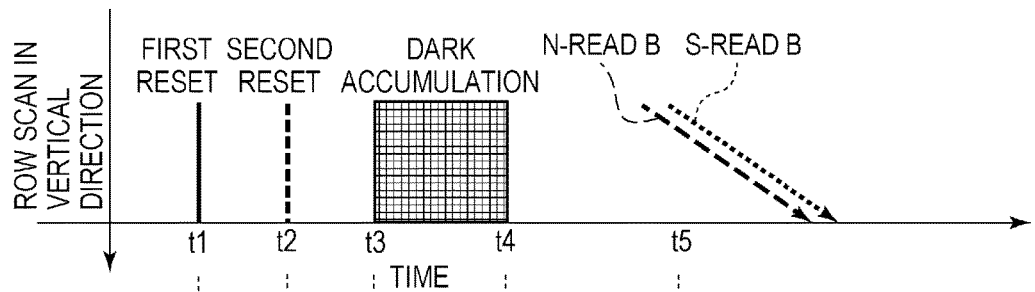
Figure 6C:
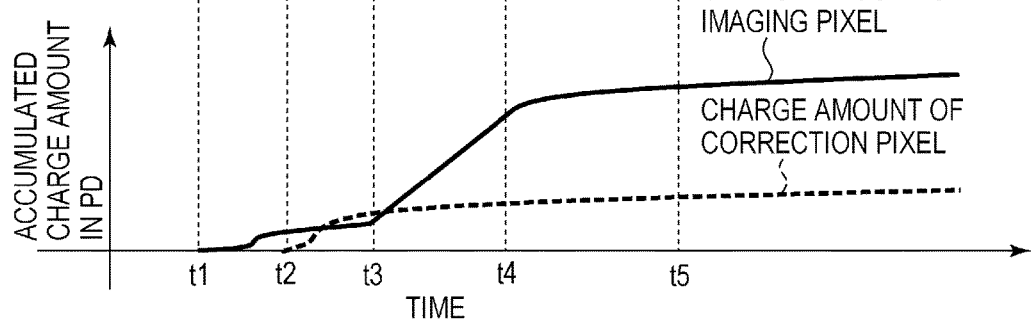

With reference to FIG. 6A, FIG. 6B, and FIG. 6C, the configuration of the second embodiment of the present invention will be described. Since the configuration of the present embodiment is the same as that of the first embodiment except the drive method at static image capturing, the description of the common features will be omitted or simplified.

FIG. 6A is a timing chart illustrating a drive method at static image capturing of the imaging pixel portion 350 according to the second embodiment of the present invention. The drive method illustrated in FIG. 6A is different from that of the first embodiment illustrated in FIG. 5A in that the second reset is not performed at the time t2 in the imaging pixel portion 350. Since drive operations at other times are the same as those in the first embodiment, the description thereof will be omitted.

FIG. 6B is a timing chart illustrating a drive method at static image capturing of the correction pixel portion 360 according to the second embodiment of the present invention. Since the drive method illustrated in FIG. 6B is the same as the drive method of the first embodiment illustrated in FIG. 5B, the description thereof will be omitted.

FIG. 6C is a graph illustrating an accumulation charge amount in each PD 311 of the imaging pixel portion 350 and the correction pixel portion 360 of the second embodiment of the present invention. Since the charge amount of the correction pixel is the same as that illustrated in FIG. 5C, the description thereof will be omitted. Since the second reset is not performed at the time t2, the charge amount of the imaging pixel increases with time elapsing from the time t1 to the time t3. This is because charges that have been captured in the defect level Et before the time t1 are emitted. This capturing of charges is due to an incident of a light to the PD 311 caused by live view, static image capturing, or the like performed before the time t1. Since the graph after the time t3 is substantially the same as that illustrated in FIG. 5C, the description thereof will be omitted.

As discussed above, also in the present embodiment, it is possible to acquire a correction signal at a high accuracy in an appropriate manner similarly to the first embodiment. In the present embodiment, however, there is a difference in the correction method due to a difference in the acquisition method of an imaging signal from that of the first embodiment. Thus, the correction method of the present embodiment will be described.

By using correction signals $N_{n,1}, N_{n,2}, \ldots, N_{n,m}$ obtained from a plurality of correction pixels on the n-th row, a correction value $C_n$ for the n-th row can be calculated by the following Equation 1 that is identical to that in the first embodiment.

$$C_n = \text{Median}(N_{n,1}, N_{n,2}, \ldots, N_{n,m}) \times k \quad \text{(Equation 1)}$$

Next, for an imaging signal $S_{n,p}$ obtained from the imaging pixel at the n-th row and the p-th column, an image signal $P_{n,p}$ in which a residual image due to charges emitted from the defect level Et has been corrected can be obtained by using the correction value $C_n$ for the n-th row as indicated in the following Equation 3.

$$P_{n,p} = S_{n,p} - C_n \times j_{n,p} \quad \text{(Equation 3)}$$

In this equation, $j_{n,p}$ is a correction coefficient of a pixel at the n-th row and the p-th column and is defined as the following Equation 4, where A1 is a predetermined coefficient.

$$j_{n,p} = S_{n,p} \times A1 \quad \text{(Equation 4)}$$

In the second embodiment, the component of charges emitted from the defect level Et contained in the imaging signal varies for each image capturing condition depending on a light amount in optical signal accumulation, an accumulation time period, or the like. In contrast, the correction signal is constant without depending on a light amount, an accumulation time period, or the like, and an even output is obtained that takes the temperature dependency of the charge emission rate from the defect level Et into consideration. Thus, correction using a value obtained by multiplying a correction value by a correction coefficient that depends on each imaging signal allows for appropriate correction. As discussed above, similarly to the first embodiment, the present embodiment also allows for acquisition of an accurate correction signal and output of a high quality image signal.

Note that, in the second embodiment, different potentials are supplied to the well (the semiconductor regions 411 and 413) of the imaging pixel portion 350 and the well (the semiconductor regions 411 and 413) of the correction pixel portion 360 temporarily in the period around the time t2. Thus, it is preferable to provide the isolation region 415 between the imaging pixel portion 350 and the correction pixel portion 360 to isolate the wells from each other as illustrated in FIG. 4B. The isolation region 415 can be configured such that an insulator is arranged to isolate the wells from each other, as seen in Shallow Trench Isolation (STI), for example. Further, the isolation region 415 may be configured such that an impurity diffusion layer whose conduction type is different from the semiconductor region 411 is provided to isolate the wells from each other. Alternatively, the isolation region 415 may be formed such that a dummy region having no PD 311 is provided between the imaging pixel portion 350 and the correction pixel portion 360 to isolate the wells from each other. Thereby, the wells are electrically isolated from each other, and it is possible to suppress deterioration of image signal that would otherwise occur due to a difference in the potentials of the well of the imaging pixel portion 350 and the well of the correction pixel portion 360. Note that the form of the above-described isolation region 415 is not limited to be applied to the second embodiment and can be similarly applied to the first, third, and fourth embodiments, for example.

Third Embodiment

With reference to FIG. 7A, FIG. 7B, FIG. 7C, and FIG. 7D, the configuration of the third embodiment of the present invention will be described. Since the present embodiment is the same as the first embodiment except the configuration of the pixel array and the drive method at static image capturing, the description of the common features will be omitted or simplified.

Figure 7A:
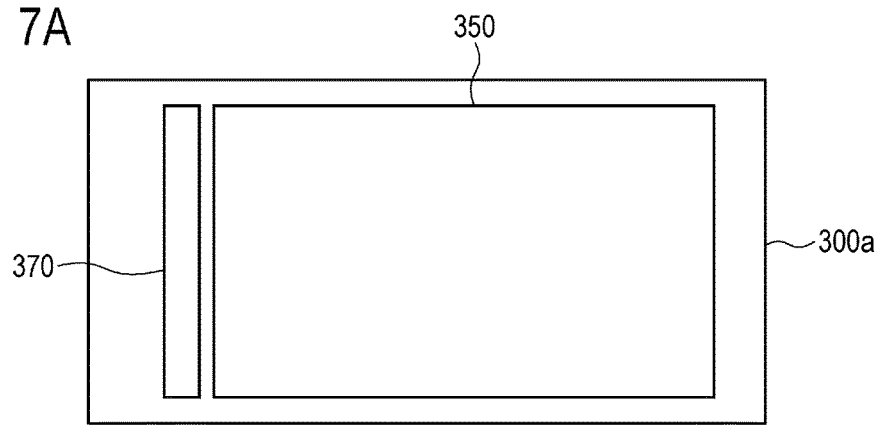
FIG. 7A, FIG. 7B, FIG. 7C, and FIG. 7D are diagrams illustrating a drive method of an imaging apparatus according to a third embodiment of the present invention.

FIG. 7A is a schematic top view illustrating the structure of the pixel array 300a according to the third embodiment of the present invention. The pixel array 300a has the imaging pixel portion 350 in which imaging pixels that output imaging signals in accordance with an incident light are arranged and a correction pixel portion 370 in which correction pixels that output correction signals for correcting the imaging signals are arranged. Each of the correction pixels provided in the correction pixel portion 370 is not a light-shielding pixel but a light-receiving pixel that has an opening that passes an incident light on the PD 311 in a similar manner to the imaging pixel, which makes a difference from the correction pixel of the correction pixel portion 360 of the first embodiment and the second embodiment. Note that, while the correction pixel portion 370 is arranged on the left side of the pixel array 300a in FIG. 7A, without being limited thereto, the imaging pixel portion 350 and the correction pixel portion 370 may be provided in any position within the pixel array 300a.

Figure 7B:
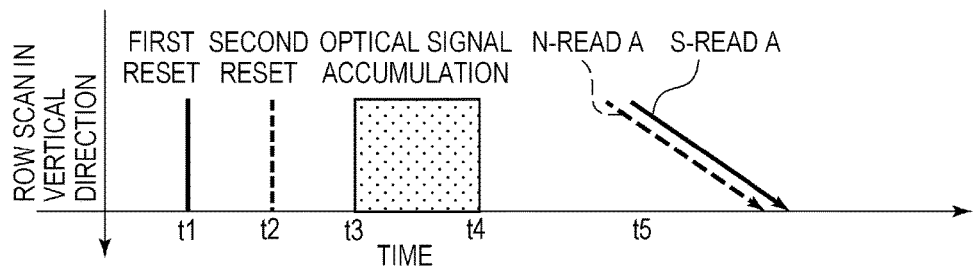

FIG. 7B is a timing chart illustrating a drive method at static image capturing of the imaging pixel portion 350 according to the third embodiment of the present invention. Since the drive method illustrated in FIG. 7B is the same as the drive method of the first embodiment illustrated in FIG. 5A, the description thereof will be omitted.

Figure 7C:
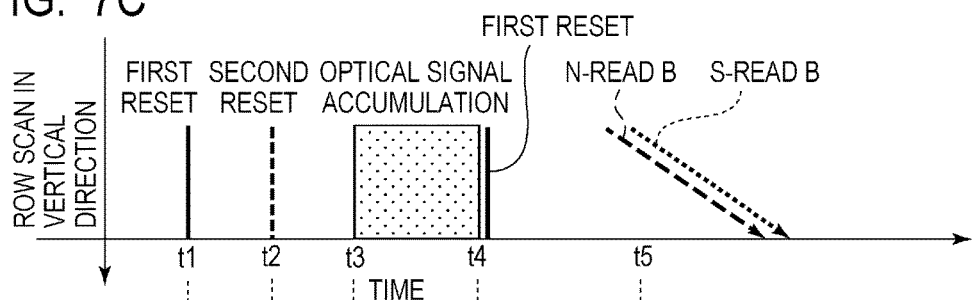

FIG. 7C is a timing chart illustrating a drive method at static image capturing of the correction pixel portion 370 of the third embodiment of the present invention. The drive method illustrated in FIG. 7C is different from that of the first embodiment illustrated in FIG. 5B in that accumulation performed in the period from the time t3 to the time t4 is not dark accumulation but optical signal accumulation and that the first reset is again performed immediately after the time t4. The first reset immediately after the time t4 is performed in synchronization with a closing operation of the mechanical shutter 101, that is, the end of exposure. Thereby, a signal obtained by the S-read B includes only the charges emitted from the defect level Et in a period from the first reset immediately after the time t4 to the readout around the time t5. Since drive operations at other times are the same as those in FIG. 5B, the description thereof will be omitted.

Figure 7D:
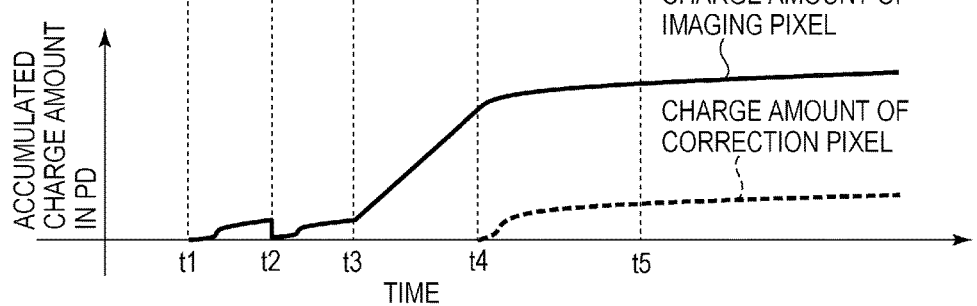

FIG. 7D is a graph illustrating an accumulation charge amount in the PD 311 of the imaging pixel portion 350 and the correction pixel portion 370 of the third embodiment of the present invention. The charge amount of the imaging pixel is the same as that illustrated in FIG. 5C, the description thereof will be omitted. The charge amount of the correction pixel increases with time elapsing on and after the time t4 due to emission of charges captured in the defect level Et by the second reset and the optical signal accumulation. Note that, since the charge amount of the correction pixel from the time t1 to the time t4 does not affect the signal obtained by the S-read B, it is not illustrated.

As discussed above, also in the present embodiment, it is possible to acquire a correction signal at a high accuracy in an appropriate manner similarly to the first and second embodiments. In the present embodiment, however, there is a difference in the correction method due to the difference in the acquisition method of a correction signal from that of the first and second embodiments. Thus, the correction method of the present embodiment will be described.

By using correction signals $N_{n,1}, N_{n,2}, \ldots, N_{n,m}$ obtained from a plurality of correction pixels on the n-th row, a correction value $C_n$ for the n-th row can be calculated by the following Equation 1 that is identical to that in the first embodiment.

$$C_n = \text{Median}(N_{n,1}, N_{n,2}, \ldots, N_{n,m}) \times k \quad \text{(Equation 1)}$$

Next, for an imaging signal $S_{n,p}$ obtained from the imaging pixel at the n-th row and the p-th column, an image signal $P_{n,p}$ in which a residual image due to charges emitted from the defect level Et has been corrected can be obtained by using the correction value $C_n$ for the n-th row as indicated in the following Equation 5.

$$P_{n,p} = S_{n,p} - C_n \times t_{n,p} \quad \text{(Equation 5)}$$

In this equation, $t_{n,p}$ is a correction coefficient of a pixel at the n-th row and the p-th column and is defined by the following Equation 6, where A2 and A3 are predetermined coefficients.

$$j_{n,p} = S_{n,p} \times (1 - \exp(-(t4-t2)/A2)) \times A3 \quad \text{(Equation 6)}$$

In the third embodiment, the component of charges emitted from the defect level Et contained in the imaging signal is resulted on and after the time t2 at which the second reset is performed. In contrast, the component of charges emitted from the defect level Et contained in the correction signal is resulted on and after the time t4 at which the second, first reset is performed. Thus, appropriate correction is allowed by multiplying the correction value by the coefficient $t_{n,p}$, which depends on (t4−t2), to modify the difference in the period in which charges have been emitted and then performing correction. As discussed above, similarly to the first embodiment and the second embodiment, the present embodiment also allows for acquisition of an accurate correction signal and output of a high quality image signal.

Fourth Embodiment

With reference to FIG. 8, FIG. 9A, FIG. 9B, FIG. 9C, and FIG. 9D, the configuration of the fourth embodiment of the present invention will be described. The configuration of the present embodiment is the same as that of the first embodiment except the configuration of the pixel array and the drive method at static image capturing. Further, some of the configuration of the pixel array and the drive method at static image capturing are common to those of the first to third embodiments. The description of these common features will be omitted or simplified.

Figure 8:
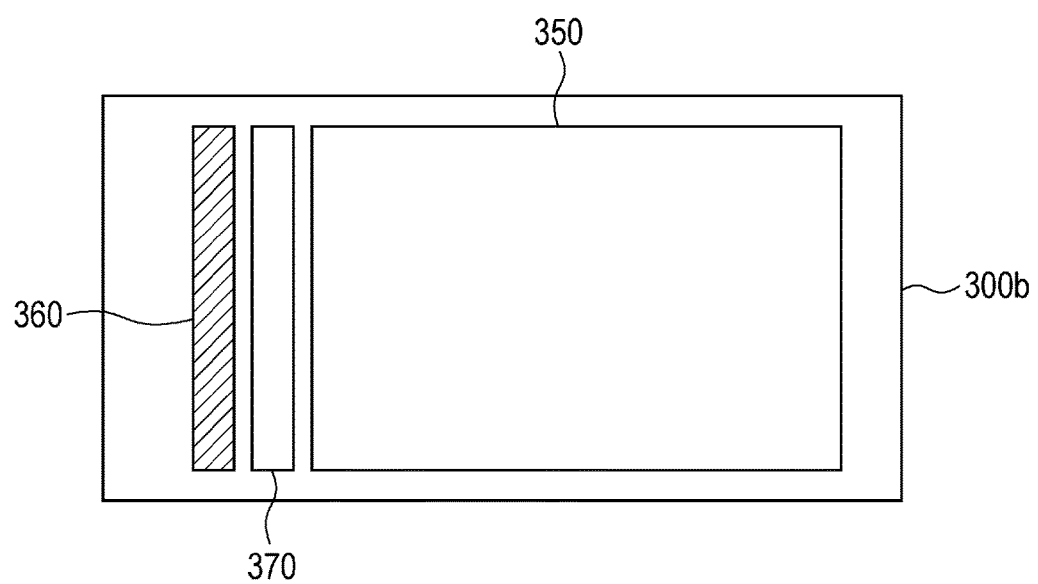
FIG. 8 is a diagram illustrating a pixel array configuration according to a fourth embodiment of the present invention.

FIG. 8 is a schematic top view illustrating the structure of the pixel array 300b according to the fourth embodiment of the present invention. The pixel array 300b has the imaging pixel portion 350, the correction pixel portion 360 including light-shielding pixels, and the correction pixel portion 370 including light-receiving pixels. The configurations of the imaging pixel portion 350 and the correction pixel portion 360 are the same as those of the first and second embodiments, and the configuration of the correction pixel portion 370 is the same as that of the third embodiment, and thus the description thereof will be omitted. Note that, while the correction pixel portions 360 and 370 are arranged in this order from on the left side of the pixel array 300a in FIG. 8, without being limited thereto, the imaging pixel portion 350 and the correction pixel portions 360 and 370 may be provided in any position within the pixel array 300b.

Figure 9A:
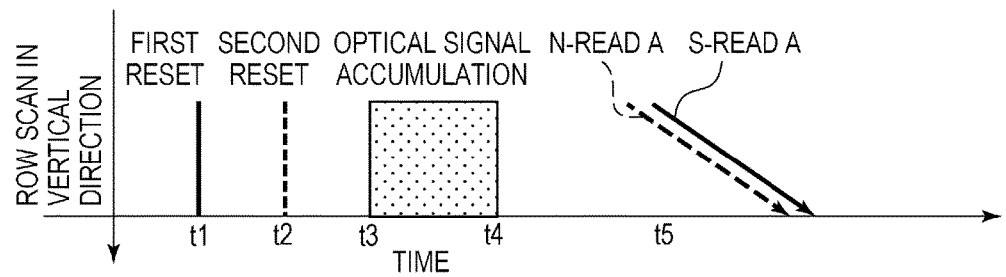
FIG. 9A, FIG. 9B, FIG. 9C, and FIG. 9D are diagrams illustrating a drive method of an imaging apparatus according to the fourth embodiment of the present invention.

FIG. 9A is a timing chart illustrating a drive method at static image capturing of the imaging pixel portion 350 according to the fourth embodiment of the present invention. Since the drive method illustrated in FIG. 9A is the same as the drive method of the first embodiment illustrated in FIG. 5A, the description thereof will be omitted.

Figure 9B:
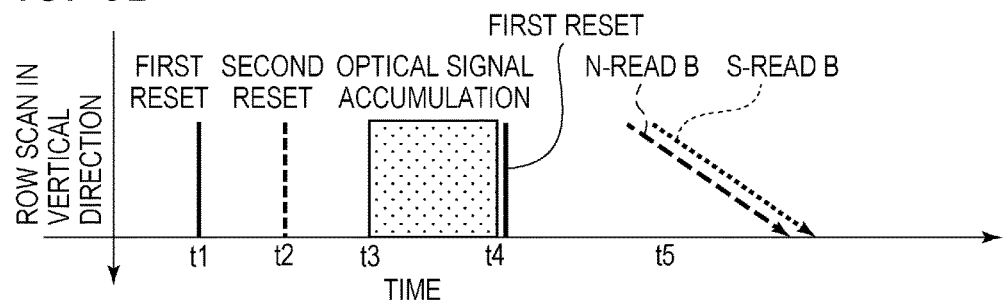

FIG. 9B is a timing chart illustrating a drive method at static image capturing of the correction pixel portion 370 of the fourth embodiment of the present invention. Since the drive method illustrated in FIG. 9B is the same as the drive method of the third embodiment illustrated in FIG. 7C, the description thereof will be omitted.

Figure 9C:
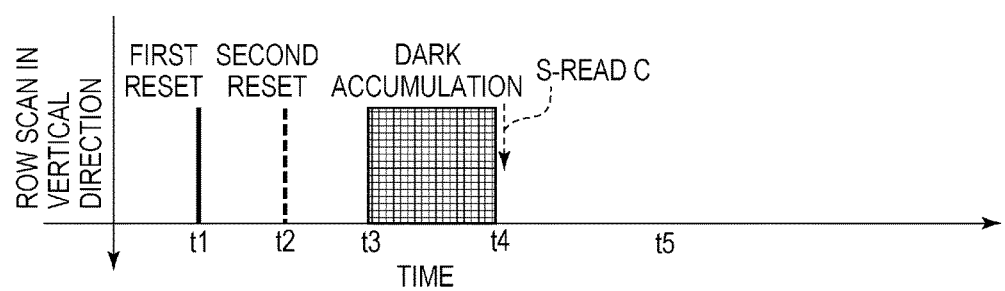

FIG. 9C is a timing chart illustrating a drive method at static image capturing of the correction pixel portion 360 of the fourth embodiment of the present invention. The drive method on and before the time t4 is the same as the drive method of the first embodiment illustrated in FIG. 5B. Immediately after the time t4, signals accumulated in the correction pixel of the correction pixel portion 360 are read out for a plurality of rows (hereafter, referred to as S-read C) in synchronization with a closing operation of the mechanical shutter 101, that is, the end of exposure.

Figure 9D:
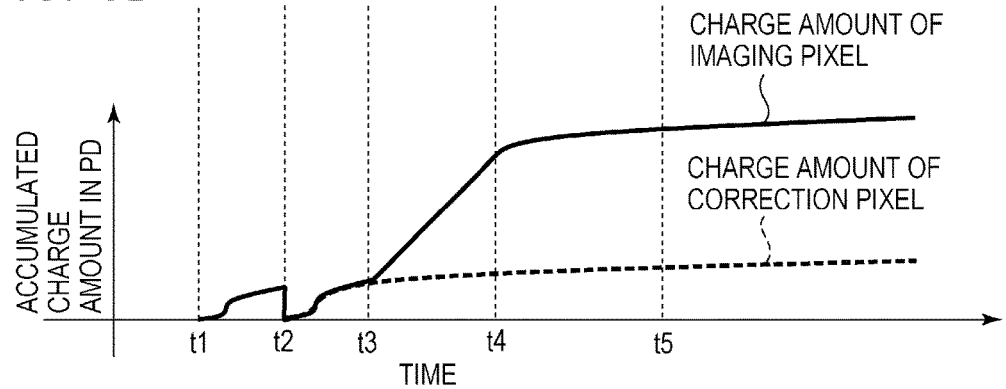

FIG. 9D is a graph illustrating an accumulation charge amount in the PD 311 of the imaging pixel portion 350 and the correction pixel portions 360 and 370 of the fourth embodiment of the present invention. The charge amount of the imaging pixel is the same as that illustrated in FIG. 5C, the description thereof will be omitted. For the charge amount of the correction pixel, FIG. 9D depicts a sum of charges accumulated in the PD 311 of the correction pixel portion 370 on and after the time t4 and charges accumulated in the PD 311 of the correction pixel portion 360 in a period from the time t2 to the time t4.

With reference to FIG. 9D, change in the charge amount in the PD 311 of the correction pixel portions 360 and 370 at each time will be described. First, the first reset is performed at the time t1, which causes both the charge amount of the correction pixel of the correction pixel portion 360 and the charge amount of the correction pixel of the correction pixel portion 370 to be zero. Further, the second reset is performed at the time t2, which causes both the charge amount of the correction pixel of the correction pixel portion 360 and the charge amount of the correction pixel of the correction pixel portion 370 to be again zero. On and after the time t2, emission of charges from the defect level Et occurs in the PD 311 of the correction pixel portions 360 and 370.

In the present embodiment, correction signals corresponding to these charges emitted from the defect level Et are acquired from both the correction pixel portion 360 and the correction pixel portion 370. At the PD 311 of the light-shielding pixel of the correction pixel portion 360, signals corresponding to charges accumulated in the period from the time t2 to the time t4 (first correction signals) are read out in the S-read C. In this light-shielding pixel, since no optical signal accumulation occurs in the period from the time t3 to the time t4, only the signal based on charge emission from the defect level Et can be acquired. Further, in the PD 311 of the light-receiving pixel of the correction pixel portion 370, a signal corresponding to charges emitted from the defect level Et in the period from the time t4 to the time of performing the S-read B (second correction signal) is read out in the S-read B.

Summing these signals allows for obtaining a correction signal taking into consideration of both the component caused by emission of charges captured in the defect level Et as a result of the second reset and the component caused by emission of charges again captured in the defect level Et as a result of optical signal accumulation. Thereby, a correction signal can be acquired at a higher accuracy in the present embodiment.

Next, the correction method in the present embodiment will be described. Correction signals obtained from a plurality of correction pixels on the n-th row of the correction pixel portion 370 are denoted as $N_{n,1}, N_{n,2}, \ldots, N_{n,m}$, and correction signals obtained from a plurality of correction pixels on the q-th row of the correction pixel portion 360 are denoted as $N_{q,1}, N_{q,2}, \ldots, N_{q,r}$. With these values, a correction value $C_n$ for the n-th row can be calculated by the following Equation 7.

$$C_n = (\text{Median}(N_{n,1}, N_{n,2}, \ldots, N_{n,m}) + \text{Median}(N_{q,1}, N_{q,2}, \ldots, N_{q,r})) \times k \quad \text{(Equation 7)}$$

For an imaging signal $S_{n,p}$ obtained from the imaging pixel at the n-th row and the p-th column, an image signal $P_{n,p}$ in which a residual image due to charges emitted from the defect level Et has been corrected can be obtained by the Equation 2, which is identical to that in the first embodiment, by using the correction value $C_n$ for the n-th row.

$$P_{n,p} = S_{n,p} - C_n \quad \text{(Equation 2)}$$

By performing calculation and correction of a correction value by using the above-described method, it is possible to correct a residual image at a higher accuracy to output a higher quality image signal.

Modified Embodiments

The embodiments described above are mere examples of some forms to which the present invention may be applied and do not prevent modifications or alterations from being made as appropriate within a scope not departing from the spirit of the present invention. For example, although the example in which all the pixels are globally reset in the first reset and the second reset has been described in the first to fourth embodiments, an operation so called a rolling operation may be employed in which the accumulation time period from reset to readout is the same for respective rows.

Further, the above-described reset and readout may be performed for multiple times if necessary within one frame period. Furthermore, a correction signal is not necessarily required to be acquired within the same frame period as an imaging signal, and a correction signal may be acquired in a different frame period from acquisition of an imaging signal. In this case, acquisition of a correction signal may occur before or after acquisition of an imaging signal.

The details of the process in correction are an example, and a different operation from that in the above-described embodiments may be performed, or another correction may be combined thereto. For example, a process may be configured in which shading correction using an output signal from a light-shielding pixel, reset noise correction using a signal obtained in the N-read, or the like in addition to an operation of the imaging signal and the correction signal is combined to the above-described embodiment. In this case, equations used in the operation may be changed as appropriate in accordance with details of the process.

With respect to the conduction type of each semiconductor region formed in the semiconductor substrate, the conduction type which has been illustrated in the above-described embodiments is an example, and the conduction type may be changed as appropriate. For example, the structure in which all the conduction types of the semiconductor regions are inverted may form an embodiment of the present invention.

In the embodiments described above, for simplified illustration, the operation of the imaging apparatus 200 or the imaging system 100 has been described assuming that acquisition of a correction signal and correction based on the correction signal are performed. In application of the present invention, however, the imaging system 100, when operating, may not perform these operations. For example, the imaging system 100 may select either one of a first mode performing acquisition of a correction signal and correction based on the correction signal and a second mode performing neither acquisition of a correction signal nor correction based on the correction signal and then pick up an image.

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-222937, filed Nov. 16, 2016, which is hereby incorporated by reference herein in its entirety.

What is claimed is:

1. An imaging apparatus comprising a pixel array in which a plurality of pixels are arranged in a matrix, each of the pixels comprising a photoelectric conversion portion,
    wherein the pixel array includes
    a first pixel configured to output an imaging signal in accordance with an incident light, and
    a second pixel configured to output a correction signal used for correcting the imaging signal, and
    wherein the second pixel outputs the correction signal after performing a first reset performed in a state where a first bias voltage is applied to the photoelectric conversion portion of the second pixel and a second reset performed in a state where a second bias voltage that is different from the first bias voltage is applied to the photoelectric conversion portion.

2. The imaging apparatus according to claim 1, wherein the first pixel outputs the imaging signal after performing the first reset and the second reset on the photoelectric conversion portion of the first pixel.

3. The imaging apparatus according to claim 1, wherein the second pixel is a light-shielding pixel comprising a light-shielding portion that shields the photoelectric conversion portion of the second pixel from an incident light.

4. The imaging apparatus according to claim 1, wherein the second pixel is a light-receiving pixel in which the photoelectric conversion portion of the second pixel receives an incident light.

5. The imaging apparatus according to claim 4, wherein the second pixel again performs the first reset in synchronization with an end of exposure performed after the first reset and the second reset are performed.

6. The imaging apparatus according to claim 1,
    wherein the first pixel has an amplification transistor configured to output the imaging signal to a signal line, and
    wherein the second pixel has an amplification transistor configured to output the correction signal to a signal line.

7. The imaging apparatus according to claim 1, wherein the pixel array includes, as the second pixel, a light-shielding pixel comprising a light-shielding portion that shields the photoelectric conversion portion of the second pixel from a light and a light-receiving pixel in which the photoelectric conversion portion of the second pixel receives an incident light.

8. The imaging apparatus according to claim 7,
    wherein the light-shielding pixel outputs a first correction signal in synchronization with an end of exposure performed after the first reset and the second reset are performed, and
    wherein the light-receiving pixel again performs the first reset in synchronization with the end of the exposure performed after the first reset and the second reset are performed and then outputs a second correction signal.

9. The imaging apparatus according to claim 8 further comprising an operation unit that calculates a correction value for each row of the pixel array based on the first correction signal and the second correction signal and performs correction of the imaging signal based on the correction value.

10. The imaging apparatus according to claim 1,
    wherein the photoelectric conversion portion includes a photodiode,
    wherein the first bias voltage is a reverse bias voltage to the photodiode, and
    wherein the second bias voltage is a forward bias voltage to the photodiode.

11. The imaging apparatus according to claim 10,
    wherein the second pixel comprises a well potential supply unit configured to supply a potential to a well in which the photodiode is formed, and
    wherein the first bias voltage and the second bias voltage are switched by a change in a potential supplied by the well potential supply unit.

12. The imaging apparatus according to claim 1 further comprising an isolation region provided between the first pixel and the second pixel.

13. The imaging apparatus according to claim 12, wherein the isolation region is a dummy region without the photoelectric conversion portion, Shallow Trench Isolation (STI), or an impurity diffusion layer.

14. The imaging apparatus according to claim 1, wherein the imaging signal and the correction signal are output by readout within the same frame period at static image capturing.

15. The imaging apparatus according to claim 1 further comprising an operation unit configured to calculate a correction value for each row of the pixel array based on the correction signal and perform correction of the imaging signal based on the correction value.

16. An imaging system comprising:
the imaging apparatus according to claim 1; and
a signal processing unit configured to process image data output from the imaging apparatus,
wherein the signal processing unit calculates a correction value for each row of the pixel array based on the correction signal and performs correction of the imaging signal based on the correction value.

17. An imaging system comprising:
the imaging apparatus according to claim 1; and
at least one of a mechanical shutter and a signal processing unit configured to process image data output from the imaging apparatus.

18. The imaging system according to claim 16, wherein either a first mode that performs acquisition of the correction signal and correction based on the correction signal or a second mode that does not perform acquisition of the correction signal and correction based on the correction signal is selected to pick up an image.

\* \* \* \* \*